(12) United States Patent
Park et al.

(10) Patent No.: US 9,401,449 B2
(45) Date of Patent: Jul. 26, 2016

(54) APPARATUS FOR MANUFACTURING AN INORGANIC THIN-FILM SOLAR CELL, AND METHOD FOR CONTROLLING SAME

(75) Inventors: Jung Jae Park, Seoul (KR); Do Yeon Kim, Seoul (KR); Jong Gun Lee, Seoul (KR); Min Wook Lee, Seoul (KR); Suk Goo Yoon, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 165 days.

(21) Appl. No.: 13/984,954

(22) PCT Filed: Feb. 9, 2012

(86) PCT No.: PCT/KR2012/000972
§ 371 (c)(1),
(2), (4) Date: Oct. 11, 2013

(87) PCT Pub. No.: WO2012/108704
PCT Pub. Date: Aug. 16, 2012

(65) Prior Publication Data
US 2014/0030825 A1    Jan. 30, 2014

(30) Foreign Application Priority Data

Feb. 10, 2011    (KR) .................. 10-2011-0012063
Jan. 18, 2012    (KR) .................. 10-2012-0005920

(51) Int. Cl.
| | |
|---|---|
| H01L 31/18 | (2006.01) |
| H01L 31/032 | (2006.01) |
| H01L 31/0749 | (2012.01) |
| H01L 31/20 | (2006.01) |
| C23C 24/04 | (2006.01) |
| H01L 21/02 | (2006.01) |

(52) U.S. Cl.
CPC .............. *H01L 31/18* (2013.01); *C23C 24/045* (2013.01); *H01L 31/0322* (2013.01); *H01L 31/0749* (2013.01); *H01L 31/206* (2013.01); *H01L 21/0259* (2013.01); *H01L 21/02568* (2013.01); *H01L 21/02628* (2013.01); *Y02E 10/541* (2013.01); *Y02P 70/521* (2015.11)

(58) Field of Classification Search
CPC ....... Y02E 10/50; H01L 31/18; H01L 31/206; H01L 31/02008; H01L 51/426; H01L 31/0392; H01L 31/055; C23C 18/1225
See application file for complete search history.

(56) References Cited

U.S. PATENT DOCUMENTS

| | | | |
|---|---|---|---|
| 6,413,794 B1 | 7/2002 | Sano et al. | |
| 7,384,680 B2 * | 6/2008 | Bi ........................ | B01J 2/006 428/143 |
| 2001/0035129 A1 * | 11/2001 | Chandra ................. | C23C 4/00 118/722 |

(Continued)

FOREIGN PATENT DOCUMENTS

| | | |
|---|---|---|
| JP | 2006-334563 A | 12/2006 |
| KR | 10-2010-0120598 A | 11/2010 |

(Continued)

*Primary Examiner* — Bac Au
(74) *Attorney, Agent, or Firm* — Rabin & Berdo, P.C.

(57) ABSTRACT

The present invention relates to an apparatus for manufacturing an inorganic thin-film solar cell, the apparatus including: a substrate stage which is mounted in a chamber and in which a solar cell substrate is disposed; and an inorganic powder supply unit including a nozzle configured to discharge an inorganic powder aerosol containing an inorganic powder onto the substrate stage in a supersonic flow so as to form a solar cell layer on the solar cell substrate, and an inorganic powder supply portion configured to supply the inorganic powder aerosol to the nozzle.

9 Claims, 10 Drawing Sheets

(56) References Cited

U.S. PATENT DOCUMENTS

| | | | |
|---|---|---|---|
| 2004/0026030 A1* | 2/2004 | Hatono | C23C 24/04 156/279 |
| 2006/0040048 A1 | 2/2006 | Han et al. | |
| 2006/0176344 A1* | 8/2006 | Mita | B41J 2/14233 347/71 |
| 2009/0148598 A1* | 6/2009 | Zolla | C23C 14/0623 427/251 |
| 2010/0028533 A1* | 2/2010 | Bollman | H01L 21/02568 427/248.1 |
| 2011/0104369 A1* | 5/2011 | Kim | C23C 24/04 427/180 |

FOREIGN PATENT DOCUMENTS

| | | |
|---|---|---|
| WO | WO-02/085532 A1 | 10/2002 |
| WO | WO-2010/011076 A2 | 1/2010 |

* cited by examiner

APPARATUS FOR MANUFACTURING AN INORGANIC THIN-FILM SOLAR CELL, AND METHOD FOR CONTROLLING SAME

TECHNICAL FIELD

The present invention relates to an apparatus for manufacturing a solar cell, and more particularly, to an apparatus for manufacturing a solar cell, in which the solar cell having a fine and dense structure can be manufactured.

BACKGROUND ART

A conventional solar cell solar cell layer formation method mostly employs an expensive and time-consuming process such as sputtering, thermal evaporation, CVD, and PVD.

As an alternative method to the conventional method, techniques such as screen printing and ink-jet printing have been proposed. However, such conventional screen printing and ink-jet printing techniques has a disadvantage in that the solar cell layer formation is limited due to the contact problem of the screen printing technique and the discharge limitation of the ink-jet printing technique.

In other words, in FIGS. 1(a) and 1(b), there is shown a conventional electrode forming process employing the screen printing technique according to the prior art. In the conventional electrode forming process, a screen 3 formed at a screen frame 2 is disposed at a position corresponding to a substrate 1. Thereafter, a paste 6 is disposed on one side of the screen 3 having a through-hole 4 formed therein, and then is shifted from the left to the right on the drawing sheet in a state of being applied a vertical pressing force to thereby form a layer 6b on one side of the substrate 1 through the through-hole 4 of the screen 3.

Such a conventional screen printing technique has an advantage in that it has a remarkable excellence in terms of the manufacturing time and manufacturing cost as compared to another conventional photolithograph technique as enabling the electrode layer to be formed at room temperature and atmospheric pressure.

However, as shown in FIG. 2, the conventional screen printing technique entails a problem in that in a spreading area As of the left and right sides of the center having the maximum height h1, the layer 6b formed one side of the substrate 1 has a height lower than the maximum height h1, and thus the aspect ratio is considerably low, leading to a reduction in the light-receiving area of a solar cell and thus an increase in the shading loss, thereby deteriorating the efficiency of the solar cell.

As such, examples of a conventional typical CIGS thin film manufacturing process include a co-evaporation method, a sputtering method, an electro-deposition method, a molecular organic chemical vapor deposition (MOCVD) method. Such conventional various methods involve a problem in that a large area is difficult to implement, contamination is serious inside a vacuum device, and a thin film having a good quality is not easy to manufacture.

In addition, during the conventional CIGS thin film manufacturing process, in the case where the electro-deposition using a precursor, a spin coating method, a doctor blade method, and an ultrasonic spray method are employed, a solute such as copper, indium, or gallium is added to a solvent such as ethanol or propylene glycol to prepare the precursor to thereby produce a CIGS thin film using the above deposition methods. However, there occurs a problem in that since a carbon layer is present as a residue in the thus produced CIGS thin film, it significantly degrades the optical conversion efficiency.

DISCLOSURE OF INVENTION

Technical Problem

Accordingly, it is an object of the present invention to provide an apparatus for manufacturing an inorganic thin-film solar cell and a method for controlling the same, in which a micro inorganic powder can be used and a micro solar cell layer can be formed through the micro inorganic powder.

Technical Solution

To achieve the above object, in one aspect, the present invention provides an apparatus for manufacturing an inorganic thin-film solar cell, the apparatus including: a substrate stage which is mounted in a chamber and in which a solar cell substrate is disposed; and an inorganic powder supply unit including a nozzle configured to discharge an inorganic powder aerosol containing an inorganic powder onto the substrate stage in a supersonic flow so as to form a solar cell layer on the solar cell substrate, and an inorganic powder supply portion configured to supply the inorganic powder aerosol to the nozzle.

In the apparatus for manufacturing an inorganic thin-film solar cell, the apparatus may further include: a voltage supply unit configured to apply a voltage between the nozzle and the substrate stage; and a control unit configured to apply an inorganic powder aerosol supply control signal to the inorganic powder supply portion to control the supply of the inorganic powder aerosol and a voltage supply control signal to the voltage supply unit to control the supply of the voltage, respectively.

In the apparatus for manufacturing an inorganic thin-film solar cell, the nozzle may be a multi-nozzle configured to separately discharge a plurality of inorganic powder aerosols in a supersonic flow.

In the apparatus for manufacturing an inorganic thin-film solar cell, the inorganic powder may contain one or more selected from the group consisting of Cu, In, Ga, Se, Cd, Te, S, Mo, and ZnO.

In the apparatus for manufacturing an inorganic thin-film solar cell, each of the separate nozzle discharge ports of the multi-nozzle may include a predetermined discharge angle.

In the apparatus for manufacturing an inorganic thin-film solar cell, the apparatus may further include a recycle unit connected to the chamber and configured to re-collect the remaining inorganic powder except the inorganic powder forming the solar cell layer.

In the apparatus for manufacturing an inorganic thin-film solar cell, the multi-nozzle may include a nozzle discharge port actuator configured to separately operate the nozzle discharge ports.

In another aspect, the present invention provides an apparatus for manufacturing an inorganic thin-film solar cell, the apparatus including: a substrate stage which is mounted in a chamber and in which a windable solar cell substrate is disposed, the substrate stage including a stage heating plate configured to provide heat to the solar cell substrate; and a roll-to-roll unit disposed at both ends of the chamber, the roll-to-roll unit including a pay-out roller mounted at one end thereof so as to allow the solar cell substrate to be paid out therefrom, and a wind-in roller mounted at the other end thereof so as to allow the solar cell substrate to be wound therearound so that the solar cell substrate can be moved while passing through the chamber; and an inorganic powder supply unit disposed in the chamber, the inorganic powder supply unit including a nozzle configured to discharge an inorganic powder aerosol containing an inorganic powder onto the substrate stage in a supersonic flow so as to form a solar cell layer on the solar cell substrate, and an inorganic powder supply portion configured to supply the inorganic powder aerosol to the nozzle, wherein the inorganic powder is deposited on the solar cell substrate.

In the apparatus for manufacturing an inorganic thin-film solar cell, the inorganic powder supply unit may include a flow regulator disposed between the inorganic powder supply portion and the nozzle and configured to regulate a flow rate of the inorganic powder aerosol, and the inorganic powder supply portion may include: a transport gas supply portion configured to provide a transport gas for transporting the inorganic powder; and an inorganic powder supply portion configured to receive the transport gas from the transport gas supply portion and feed the inorganic powder aerosol to the nozzle through the supply of the inorganic powder by virtue of the flow of the transport gas.

In the apparatus for manufacturing an inorganic thin-film solar cell, the inorganic powder supply portion may further include a gas heater provided at the transport gas supply portion and the inorganic powder supply portion and configured to supply heat to the transport gas to pre-heat the inorganic powder introduced into the inorganic powder supply portion.

In the apparatus for manufacturing an inorganic thin-film solar cell, the apparatus may further include: a sensing unit including a nozzle temperature sensor disposed at the nozzle and configured to detect the temperature of the inorganic powder aerosol through the nozzle, a nozzle pressure sensor disposed at the nozzle and configured to detect the pressure of the inorganic powder aerosol through the nozzle, a chamber temperature sensor configured to detect the internal temperature of the chamber, and a image sensor portion disposed between the nozzle and the wind-in roller and configured to detect image information on the solar cell substrate; a control unit connected to the sensing unit and configured to receive the detected signal from the sensing unit; an arithmetic operation unit configured to calculate the nozzle velocity of the inorganic powder aerosol discharged through the nozzle based on the detected signals of the nozzle pressure sensor and the nozzle temperature sensor in response to an operation control signal from the control unit; and a storage unit connected to the storage unit and configured to store a preset data containing a reference nozzle velocity compared with the nozzle velocity to determine whether or not the discharge state of the nozzle is in a normal state, and a reference thickness compared with the thickness information extracted from the image information to determine whether or not the thickness of the inorganic powder sprayed onto the one side of the solar cell substrate is normal.

In the apparatus for manufacturing an inorganic thin-film solar cell, the multi-nozzle may be a multi-nozzle configured to individually discharge a plurality of inorganic powder aerosol in a supersonic flow.

In the apparatus for manufacturing an inorganic thin-film solar cell, the multi-nozzle may be provided in plural numbers, and any one of the plurality of multi-nozzles may discharge an inorganic powder different from one discharged from another multi-nozzle.

In the apparatus for manufacturing an inorganic thin-film solar cell, the inorganic powder may contain one or more selected from the group consisting of Cu, In, Ga, Se, Cd, Te, S, Mo, and ZnO.

In the apparatus for manufacturing an inorganic thin-film solar cell, the apparatus may further include a recycle unit connected to the chamber and configured to re-collect the remaining inorganic powder other than the inorganic powder forming the solar cell layer.

In still another aspect, the present invention provides a method for controlling an apparatus for manufacturing an inorganic thin-film solar cell, the method including: an apparatus provision step of providing the apparatus for manufacturing an inorganic thin-film solar cell according to claim 8, the apparatus including: a sensing unit including a nozzle temperature sensor disposed at the nozzle and configured to detect the temperature of the inorganic powder aerosol through the nozzle, a nozzle pressure sensor disposed at the nozzle and configured to detect the pressure of the inorganic powder aerosol through the nozzle, a chamber temperature sensor configured to detect the internal temperature of the chamber, and a image sensor portion disposed between the nozzle and the wind-in roller and configured to detect image information on the solar cell substrate; a control unit connected to the sensing unit and configured to receive the detected signal from the sensing unit; an arithmetic operation unit configured to calculate the nozzle velocity of the inorganic powder aerosol discharged through the nozzle based on the detected signals of the nozzle pressure sensor and the nozzle temperature sensor in response to an operation control signal from the control unit; and a storage unit connected to the storage unit and configured to store a preset data containing a reference nozzle velocity compared with the nozzle velocity to determine whether or not the discharge state of the nozzle is in a normal state, and a reference thickness compared with the thickness information extracted from the image information to determine whether or not the thickness of the inorganic powder sprayed onto the one side of the solar cell substrate is normal; a spray and deposition step of allowing the control unit to apply a supply control signal to the inorganic powder supply unit, and apply a feed control signal to the roll-to-roll unit to discharge the inorganic powder aerosol to the solar cell substrate to cause the inorganic powder to be deposited on the solar cell substrate; a detection step of allowing the control unit to apply a detection control signal to the sensing unit; and a regulation step of allowing the control unit to regulate the discharge velocity of the nozzle and the feed rate of the solar cell substrate using the detected signal of the sensing unit and the preset data stored in the storage unit.

In the control method of the apparatus for manufacturing an inorganic thin-film solar cell, the inorganic powder supply unit may include a flow regulator disposed between the inorganic powder supply portion and the nozzle and configured to regulate a flow rate of the inorganic powder aerosol, wherein the inorganic powder supply portion may include: a transport gas supply portion configured to provide a transport gas for transporting the inorganic powder; an inorganic powder supply portion configured to receive the transport gas from the transport gas supply portion and feed the inorganic powder aerosol to the nozzle through the supply of the inorganic powder by virtue of the flow of the transport gas; and a gas heater provided at the transport gas supply portion and the inorganic powder supply portion and configured to supply heat to the transport gas to pre-heat the inorganic powder introduced into the inorganic powder supply portion, and wherein the spray and deposition step may include: a pre-heating step of allowing the control unit to apply a transport control signal to the transport gas supply portion and apply a pre-heating control signal to the gas heater to pre-heat the transport gas; a powder supply step of allowing the control unit to apply a feed control signal to the inorganic powder feeder to supply the inorganic powder to the inorganic powder feeder; and a discharge step of allowing the control unit to apply a flow control signal to the flow regulator to discharge the inorganic powder aerosol from the nozzle.

In the control method of the apparatus for manufacturing an inorganic thin-film solar cell, the method may further include a regulation step, wherein the regulation steps may include: a nozzle velocity calculation step of allowing the arithmetic operation unit to calculate the nozzle velocity of the inorganic powder aerosol discharged through the nozzle based on the detected signals of the nozzle pressure sensor and the nozzle temperature sensor in response to an operation control signal from the control unit; a nozzle velocity determination step of allowing the control unit to compare the nozzle velocity with the reference nozzle velocity; and a deposition thickness determination step of, if the nozzle velocity conforms to the reference nozzle velocity in the nozzle velocity determination step, comparing the thickness information extracted from the image information with the reference thickness.

Advantageous Effects

According to the apparatus for manufacturing an inorganic thin-film solar cell and a method for controlling the same of the present invention having the same configuration as described above have the following advantageous effects.

First, according to the apparatus for manufacturing an inorganic thin-film solar cell and a method for controlling the same of the present invention, although an expensive fine nozzle is not implemented through a low-temperature spray scheme, the discharge of the inorganic powder aerosol having fine particles is possible, and the micro solar cell layer can be formed in an accurate and stable manner through the voltage supply unit, thereby improving the efficiency of the solar cell and reducing the manufacturing cost.

Second, according to the apparatus for manufacturing an inorganic thin-film solar cell and a method for controlling the same of the present invention, the necessity of an expensive fine nozzle is eliminated through a low-temperature spray scheme so that a powder aerosol containing the inorganic powder having micro-sized particles can be discharged, thereby significantly reducing the material cost and thus the manufacturing cost.

Third, according to the apparatus for manufacturing an inorganic thin-film solar cell and a method for controlling the same of the present invention, a simple non-contact formation of the solar cell layer is possible, making it possible to form the micro solar cell layer more accurately, thereby remarkably increasing the production yield owing to simplification of the manufacturing process.

Fourth, according to the apparatus for manufacturing an inorganic thin-film solar cell and a method for controlling the same of the present invention, the simultaneous spray or selective local spray is possible through the multi-nozzle to accurately adjust compactness of a structure (texture) of the solar cell layer such as a CIGS layer so that a solar cell layer having excellent durability can be formed.

Fifth, according to the apparatus for manufacturing an inorganic thin-film solar cell and a method for controlling the same of the present invention, the simultaneous spray or selective local spray is possible through the multi-nozzle to accurately and uniformly adjust the composition ratio of a structure of the solar cell layer such as a CIGS layer so that a high efficiency solar cell layer having excellent uniformity can be formed.

Sixth, according to the apparatus for manufacturing an inorganic thin-film solar cell and a method for controlling the same of the present invention, the simultaneous spray or selective local spray is possible through the multi-nozzle and a multiplication of an impulse or a precise targeting effect due to the electrostatic field through the voltage supply unit are involved to accurately and uniformly adjust the composition ratio of a structure of the solar cell layer such as a CIGS layer so that a high efficiency solar cell layer having excellent uniformity can be formed and at the same time the solar cell layer with a large-scale area can be implemented, thereby increasing the production.

Seventh, according to the apparatus for manufacturing an inorganic thin-film solar cell and a method for controlling the same of the present invention, a solar cell layer can be coated in a low-temperature supersonic flow on a continuous windable solar cell substrate through the roll-to-roll unit, thereby maximizing the production yield.

Eighth, according to the apparatus for manufacturing an inorganic thin-film solar cell and a method for controlling the same of the present invention, the inorganic powder having nano-sized particles charged to the high-temperature transport gas is formed in a melting state through the pre-heating of the transport gas to increase the momentum so that the inorganic powder can be deposited on the solar cell substrate more easily.

Ninth, according to the apparatus for manufacturing an inorganic thin-film solar cell and a method for controlling the same of the present invention, the inorganic powder particles such as Cu, In, Se, and Ga is induced to be compactly deposited on the solar cell substrate through the heating of the substrate stage, and crystallization is achieved so that the solar cell layer having a compact structure having minimized pores is formed, thereby maximizing the optical (photo-electric) conversion efficiency of the solar cell.

Tenth, according to the apparatus for manufacturing an inorganic thin-film solar cell and a method for controlling the same of the present invention, the formation of a precursor is excluded and the solar cell layer is formed at room temperature and atmospheric pressure so that a carbon layer involved due to the use of the precursor is excluded to maximize the optical conversion efficiency of the solar cell layer, minimize the manufacturing cost through the process performed under the atmospheric pressure, and simplify the structure of the chamber due to the process through the process performed under the atmospheric pressure so that the inside of the chamber can be observed with naked eyes, thereby allowing an worker to easily observe the solar cell manufacturing process.

Eleventh, according to the apparatus for manufacturing an inorganic thin-film solar cell and a method for controlling the same of the present invention, the velocity of the particles of the inorganic powder aerosol discharged can be detected in real time through the measurement of the thickness of the solar cell layer or the pressure and temperature of the nozzle to perform the control process through this measurement so that the solar cell including a good quality solar cell layer having a designed structure can be manufactured.

BRIEF DESCRIPTION OF THE DRAWINGS

The above and other objects, features and advantages of the present invention will be apparent from the following detailed description of the preferred embodiments of the invention in conjunction with the accompanying drawings, in which.

BEST MODE FOR CARRYING OUT THE INVENTION

Now, preferred embodiments of an apparatus for manufacturing an inorganic thin-film solar cell and a method for controlling the same according to the present invention will be described hereinafter in detail with reference to the accompanying drawings.

Figure 3:
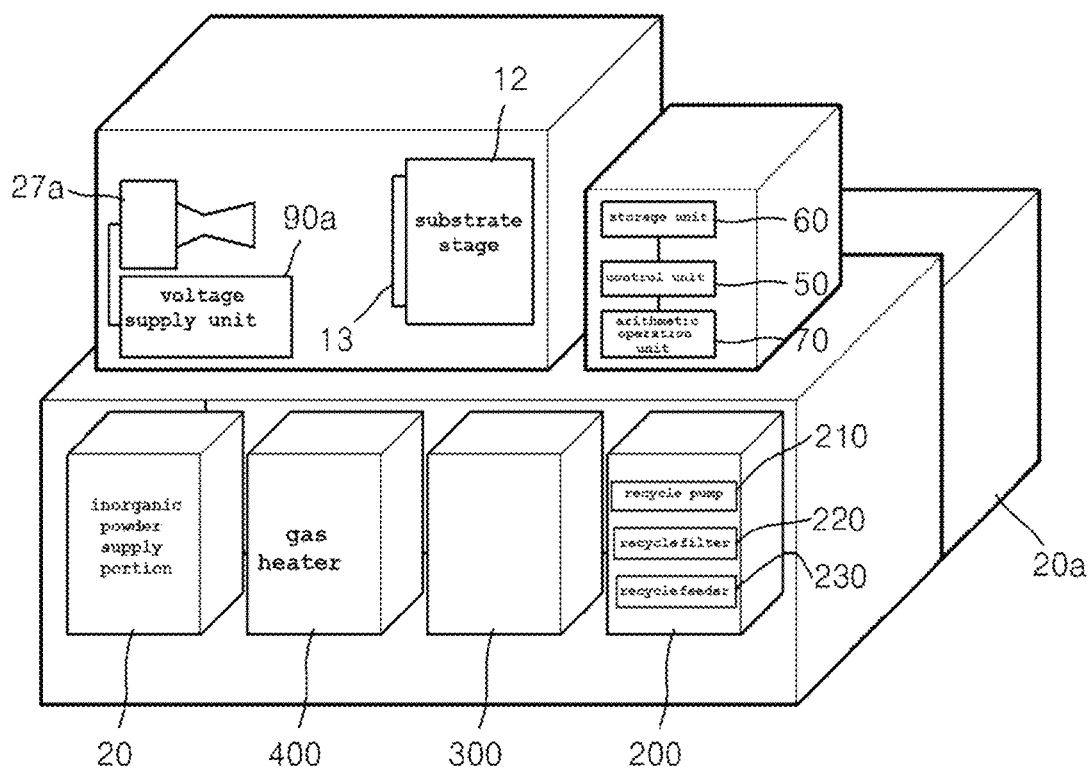
FIG. 3 is a schematic state view illustrating an apparatus for manufacturing an inorganic thin-film solar cell according to an embodiment of the present invention.
Figure 4:
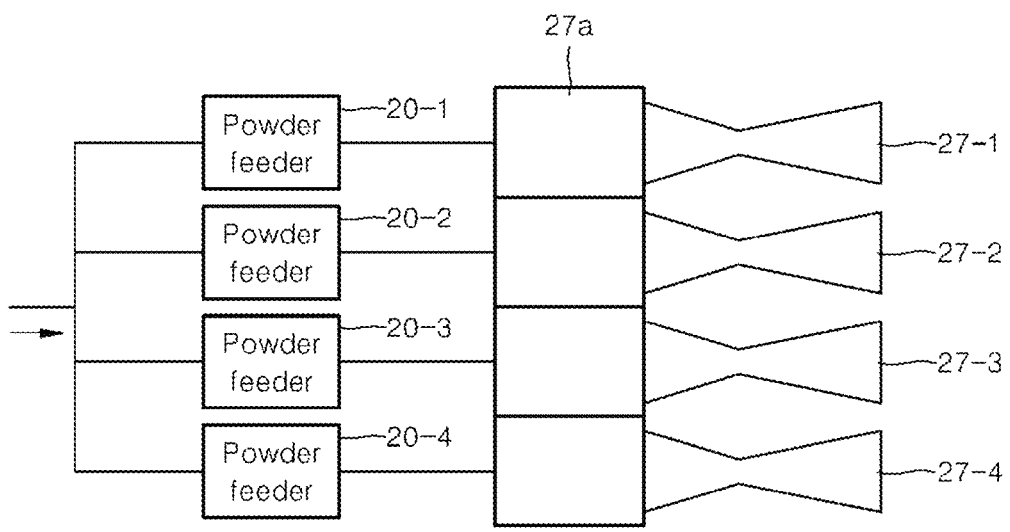
FIG. 4 is a state view illustrating an example of a multi-nozzle of an apparatus for manufacturing an inorganic thin-film solar cell according to an embodiment of the present invention.
Figure 5:
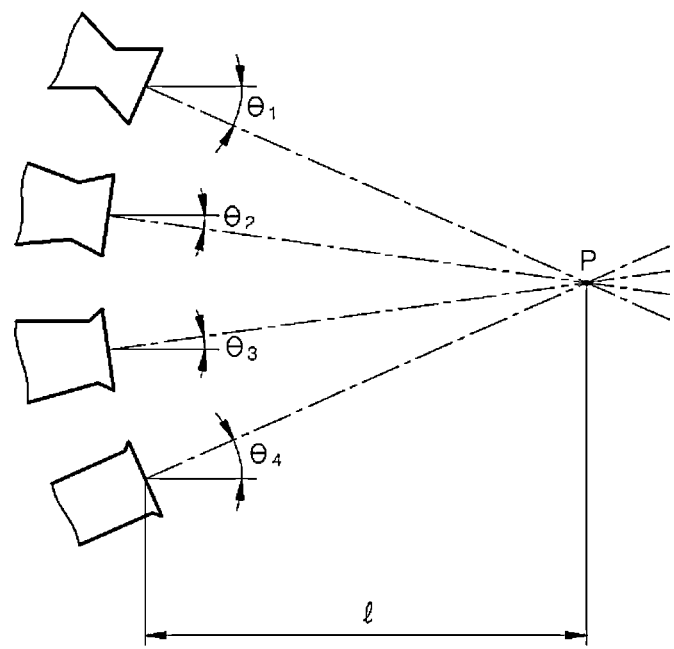
FIG. 5 is a state view illustrating another example of a multi-nozzle of an apparatus for manufacturing an inorganic thin-film solar cell according to an embodiment of the present invention.
Figure 6:
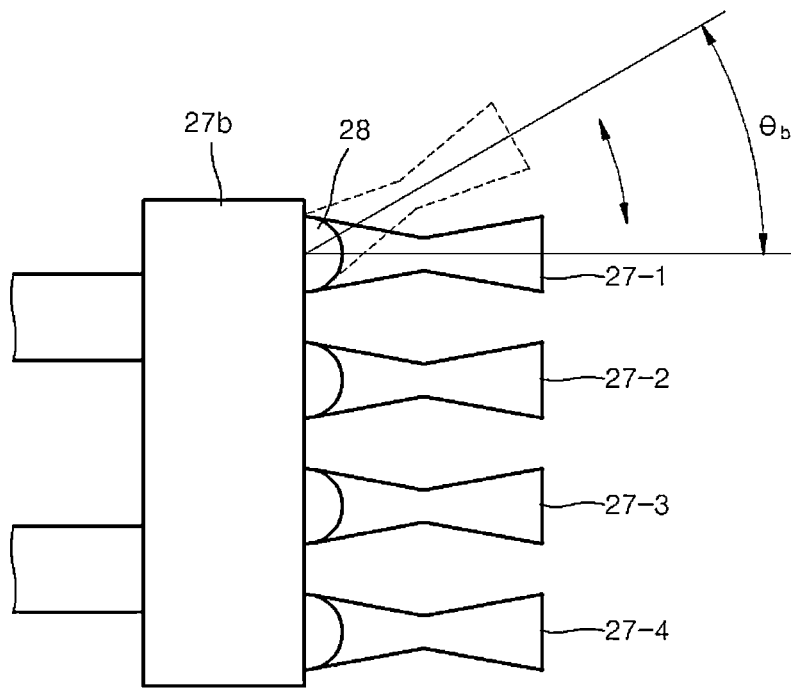
FIG. 6 is a state view illustrating still another example of a multi-nozzle of an apparatus for manufacturing an inorganic thin-film solar cell according to an embodiment of the present invention.

FIG. 3 is a schematic state view illustrating an apparatus for manufacturing an inorganic thin-film solar cell according to an embodiment of the present invention, FIG. 4 is a state view illustrating an example of a multi-nozzle of an apparatus for manufacturing an inorganic thin-film solar cell according to an embodiment of the present invention, FIG. 5 is a state view illustrating another example of a multi-nozzle of an apparatus for manufacturing an inorganic thin-film solar cell according to an embodiment of the present invention, and FIG. 6 is a state view illustrating still another example of a multi-nozzle of an apparatus for manufacturing an inorganic thin-film solar cell according to an embodiment of the present invention.

An apparatus 10 for manufacturing an inorganic thin-film solar cell according to an embodiment of the present invention includes a substrate stage 12, an inorganic powder supply unit 20 and 27, a voltage supply unit 90a. In addition, the apparatus 10 for manufacturing an inorganic thin-film solar cell includes a control unit 50 for generating a control signal for application to the substrate stage 12, the inorganic powder supply unit, and the voltage supply unit 90a, a storage unit 60 connected to the control unit 50 for storing a preset data, and an arithmetic operation unit 70 for executing an operation function in response to an operation control signal from the control unit 50.

The substrate stage 12 is disposed in a non-vacuum state at room temperature. The substrate stage 12 is disposed inside a chamber 11 which forms non-vacuum and room temperature state. A solar cell substrate 13 is disposed on one side of the substrate stage 12.

The substrate stage 12 may be configured as a stage in which a movement is performed about X, Y and Z axes. The substrate stage 12 may perform a movement on an XY plane on a plane perpendicular to a segment connecting the nozzle 27 and the substrate stage 12, and may perform a movement in a direction of a Z axis perpendicular to a segment formed by the substrate stage 12 and the nozzle 27 according the circumstances. In addition, the substrate stage 12 is connected to the control unit 50 so that it may be moved in response to a stage control signal from the control unit 50.

The inorganic powder supply unit includes an inorganic powder supply portion 20 and a nozzle 27. The nozzle 27 discharges an inorganic powder aerosol containing an inorganic powder onto the solar cell substrate 14 of the substrate stage 12 in a supersonic flow so as to form a solar cell layer on the solar cell substrate. The inorganic powder supply portion 13 supplies the inorganic powder aerosol to the nozzle 27.

In this embodiment, the nozzle 27 is configured as a structure having a convergent-divergent shape so as to form the supersonic flow. That is, the inorganic powder aerosol which passes through a convergent section and a divergent section is discharged from the nozzle 27 while forming the supersonic flow toward the solar cell substrate 13. The inorganic powder aerosol discharged in the supersonic flow densely forms a structure of the solar cell layer due to a proper impulse at the time of formation of the solar cell layer on the solar cell substrate to cause the transfer of electrons to be more smoothly, thereby ultimately increasing the optical conversion efficiency of the solar cell.

The inorganic powder aerosol supplied to the nozzle through the inorganic powder supply portion 20 is discharged and sprayed onto the solar cell substrate 13 through the nozzle 27. The inorganic powder supply portion 20 may include an inorganic powder supply portion (not shown) that feeds the inorganic powder and a transport gas supply portion 20a that supplies a transport gas as a carrier gas for forming the inorganic powder aerosol containing the inorganic powder to be discharged and sprayed onto the solar cell substrate 13 through the nozzle 27.

In other words, a high-pressure transport gas supplied from the transport gas supply portion 20a and an inorganic powder supplied through the inorganic powder supply portion of the inorganic powder supply portion are supplied to the nozzle 27. At this time, in a process in which the transport gas is sprayed through the nozzle, the inorganic powder being supplied is discharged through the nozzle together with the transport gas in the form of an inorganic powder aerosol.

The transport gas is preferably an inert gas such as $N_2$. The transport gas to be supplied to the nozzle 27 is delivered to the nozzle 27 in the form of a pre-heated high pressure gas through a gas heater. In addition, the inorganic powder supplied to the nozzle 27 is mixed with the transport gas in a process in which the high-pressure transport gas is sprayed.

Thus, in a process in which the inorganic powder is discharged and sprayed through the nozzle 27 implemented in a convergent-divergent shape, the inorganic powder is sprayed in the form of an inorganic powder aerosol onto one side of the solar cell substrate 13 disposed on the substrate stage 12.

The inorganic powder supply portion 20 may further include a crushed inorganic powder provision portion 300 at a front end thereof. The crushed inorganic powder provision portion 300 provides a crushed inorganic powder.

The crushed inorganic powder provision portion 300 includes an inorganic powder crusher 310 and an inorganic powder drier 330. When the inorganic powder crusher 310 is configured in the form of a ball mill, it crushes metal materials charged thereto into fine particles with a preset size, particularly into inorganic powder particles with a size less than a micro-size in this embodiment.

The inorganic powder drier 330 receives the crushed inorganic powder from the inorganic powder crusher 310 and performs a dry process on the crushed inorganic powder under preset conditions. The inorganic powder from which moisture is removed in the inorganic powder drier 330 is delivered to the nozzle 27 via the inorganic powder supply portion 20 so that it can be discharged and sprayed in the form a supersonic flow.

In addition, the solar cell layer formation apparatus 10 according to the present invention may include a recycle unit 200. The recycle unit 200 is connected to the chamber 11 and re-circulates the transport gas inside the chamber 11 to trap and re-collect the inorganic powder floating inside the chamber 11.

A worker may collect the trapped inorganic powder periodically and input the collected inorganic powder to the inorganic powder supply portion 20 or the crushed inorganic powder provision portion 300. The recycle unit 200 includes a recycle pump 210, a recycle filter 220, and a recycle feeder 230.

The control unit 50 generates a recycle pump control signal for application to the recycle pump 210 of the recycle unit 200 to operate the recycle pump 210. Thus, when the inorganic powder is trapped in the re-circulation process through the recycle filter 220, the control unit 50 may apply a recycle feed control signal to the recycle feeder 230 and the trapped inorganic powder is again supplied to crushed inorganic powder provision portion 300. The control unit 50 can perform a series of such recycling processes.

The apparatus 10 for manufacturing an inorganic thin-film solar cell according to an embodiment of the present invention includes a voltage supply unit 90a. The voltage supply unit 90a applies a voltage between the nozzle 27 and the substrate stage 12. The control unit 50 generates a voltage application control signal for application to the voltage supply unit 90a to cause the voltage supply unit 90a to apply a predetermined discharge signal to the nozzle so as to increase an acceleration of the inorganic powder aerosol discharged in a supersonic flow through the nozzle 27 and thus promote the mounting of the inorganic solar cell layer on the solar cell substrate so that a more dense solar cell layer can be formed. The voltage supply unit 90a applies a voltage between the nozzle 27 and the substrate stage 12 in response to the voltage supply control signal applied to the voltage supply unit 90a from the control unit 50. In this case, the applied voltage is in the range of from 1 kV to 30 kV.

Meanwhile, the nozzle 27 of the apparatus 10 for manufacturing an inorganic thin-film solar cell according to an embodiment of the present invention is a multi-nozzle 27a. FIG. 4 is shows an example of the multi-nozzle 27a according to an embodiment of the present invention. The multi-nozzle 27a includes a plurality of nozzle discharge ports 27-1 to 27-4. Each of individual inorganic powder supply portions 20-1 to 20-4 is disposed at an associated one of the nozzle discharge ports 27-1 to 27-4.

Although it has been described in this embodiment that the multi-nozzle 27a includes four nozzle discharge ports, various modifications can be made depending on the design specifications, such as having a structure in which more than four nozzle discharge ports are provided. In addition, in this embodiment, the nozzle discharge ports have a structure in which they are arranged in a row, but various modifications can be made depending on the design specifications, such as having a structure in which nozzle discharge ports are arranged in a circular shape.

Inorganic powder aerosols containing different inorganic powders may be discharged and sprayed through the plurality of nozzle discharge ports. The different inorganic powders may contain one or more selected from the group consisting of Cu, In, Ga, Se, Cd, Te, S, Mo, and ZnO.

The solar cell layer having a dense structure and excellent optical conversion efficiency can be formed through the simultaneous spray of the inorganic powder.

In addition, the multi-nozzle 27a of the apparatus 10 for manufacturing an inorganic thin-film solar cell according to the present invention may be implemented as a structure in which a solar cell layer capable of enhancing the optical conversion efficiency of the inorganic thin-film solar cell is formed.

In other words, in the case where the nozzle discharge ports are arranged in a row, the discharge positions of the inorganic powders of the respective inorganic powder aerosols on the solar cell substrate are different from one another, and thus a structure may be implemented in which the nozzle discharge ports 27-1 to 27-4 form predetermined discharge angles (θ1, θ2, θ3, and θ4) to increase the compactness of a structure of the solar cell layer. Therefore, the inorganic powders may be discharged and sprayed onto a same or substantially same target position (P) on the solar cell substrate 13 with respect to the substrate stage 12 spaced apart from the nozzle discharge ports by a distance (l).

Further, the nozzle discharge ports 27-1 to 27-4 of the multi-nozzle 27b may be implemented as a structure in which they are operated separately in consideration of changes in the distance between the nozzle and the substrate stage due to the movement of the multi-nozzle 27a on the vertical segment formed by the substrate stage 12 and the multi-nozzle 27a, according to the circumstance. In other words, the multi-nozzle 27b includes a nozzle discharge port actuator 28 disposed at each of the nozzle discharge ports 27-1 to 27-4 thereof so that the nozzle discharge port actuator is operation to cause the nozzle discharge ports to be actuated in response to a nozzle discharge port actuation control signal from the control unit 50. Thus, the actuation angle of the nozzle discharge ports is adjusted to a predetermined angle (θb), so that the nozzle discharge ports can actively cope with the changes in the distance between the multi-nozzle 27b and the substrate stage 12, thereby enabling the adjustment of a target position of each of the inorganic powder aerosols.

Figure 7:
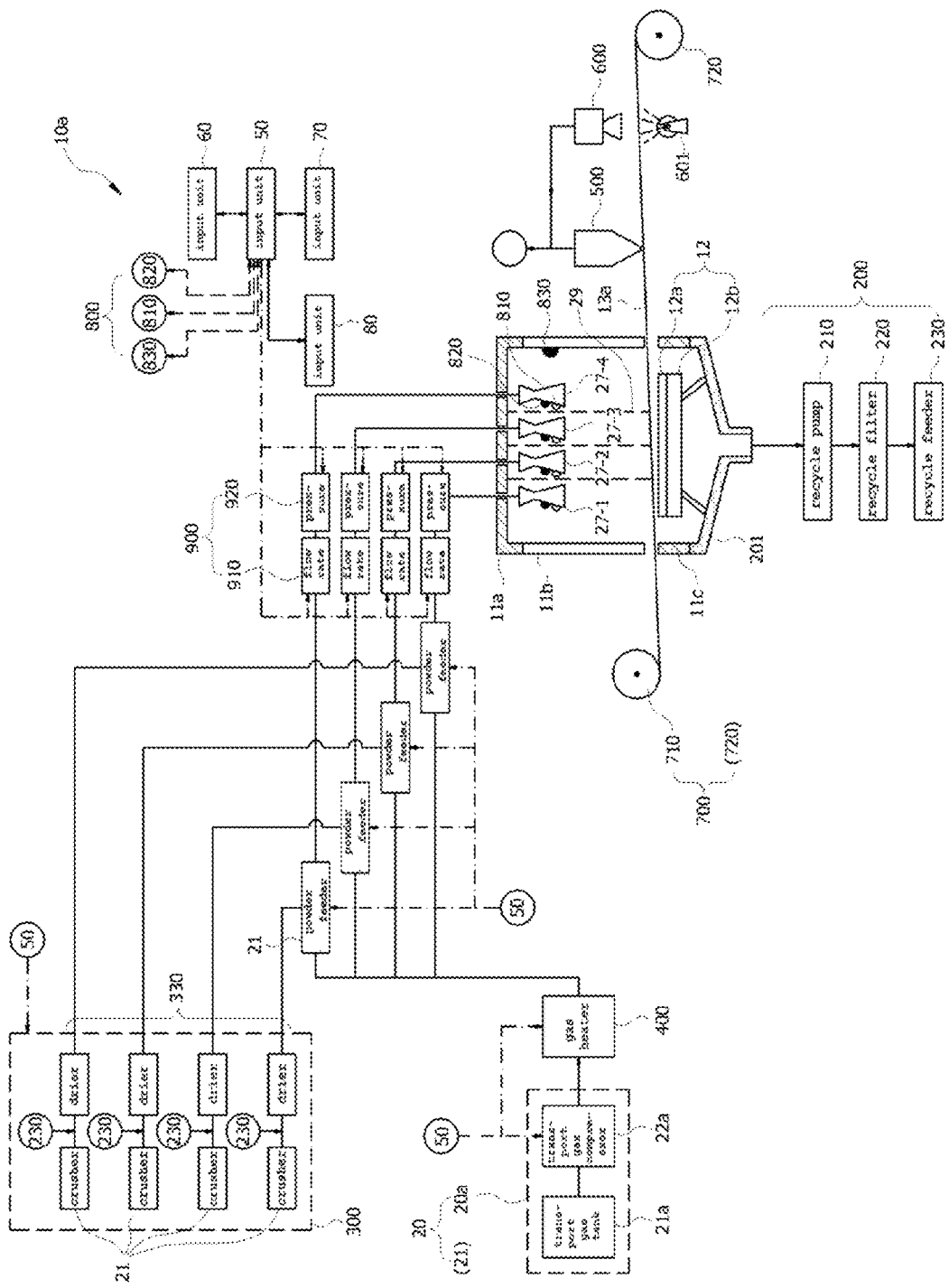
FIG. 7 is a schematic block diagram illustrating an apparatus for manufacturing an inorganic thin-film solar cell according to another embodiment of the present invention.

In the meansme, although the apparatus for manufacturing an inorganic thin-film solar cell according to the present invention has been described centering on a single solar cell substrate in the above embodiment, it may be applied to a flexible solar cell substrate having a continuous winding structure. In other words, FIG. 7 shows an apparatus 10a for manufacturing an inorganic thin-film solar cell according to another embodiment of the present invention. The apparatus 10a for manufacturing an inorganic thin-film solar cell includes a substrate stage 12, an inorganic powder supply unit, and a roll-to-roll unit 700. To avoid a redundant description, like or same reference numerals in the above embodiment are given to corresponding elements or parts of this embodiment, and the same constitution will be replaced with the constitution in the above embodiment.

The substrate stage 12 is mounted inside a chamber 11, and a windable solar cell substrate 13 is disposed in the substrate stage 12. The chamber 11 includes a chamber upper portion 11a and a chamber body 11b. The chamber upper portion 11a and the chamber body 11b are engaged with each other to define an internal space therebetween. The chamber upper portion 11a is disposed on the top of the chamber body 11b and includes a plurality of lines formed penetratingly therein to form the flow of the inorganic powder aerosol.

The chamber upper portion 11a is engaged with the chamber body 11b. The chamber body 11b is formed of a transparent material so that a solar cell formation state can be observed with naked eyes in which the inorganic powder aerosol discharged through a supersonic nozzle is deposited on the solar cell substrate in the internal space defined between the chamber upper portion 11a and the chamber body 11b.

In this embodiment, the apparatus 10a for manufacturing an inorganic thin-film solar cell takes a structure in which the chamber body 11b is formed of a transparent material, but it may be constructed in various manners, such as taking a structure in which a viewing window is formed on the chamber body 11b or the chamber upper portion 11a.

The chamber body 11b includes an entry port 11b-1 and an exit port 11b-2 formed therein. The entry port 11b-1 and the exit port 11b-2 have a structure in which they are arranged on a straight line so as to be opposed to each other. A windable solar cell substrate 13 is fed through the entry port 11b-1 and the exit port 11b-2.

A substrate stage 12 is disposed in the internal space defined between the chamber upper portion 11a and the chamber body 11b. The substrate stage 12 takes a structure in which a solar cell substrate 13 is contactingly fed. Although it has been illustrated in FIG. 7 that the substrate stage 12 is supported by the inner surface of a recycle chamber 201 of the recycle unit 200 which will be described, this is merely illustrative of a support portion and the substrate stage 12 may take a structure in which it is mounted at the inner side of the chamber body 11b and is supported by the inner surface.

A separate chamber base 11c is formed at a lower portion of the chamber body 1b and may take a separate structure, if necessary. The chamber may be constructed in various manners within a range of allowing the chamber upper portion, the chamber body, and the chamber base to define the internal space. Although it has been described in this embodiment that the chamber base 11c is formed at a lower portion of the chamber body 1b and the chamber body 1b is connected to the recycle chamber 201 of the recycle unit 200 through the chamber base 11c, in the case where the chamber base is formed integrally with the chamber body, the recycle chamber may take a structure of being directly connected to the chamber body.

In this embodiment, the apparatus 10a for manufacturing an inorganic thin-film solar cell takes a structure in which the recycle chamber 201 is connected to the bottom of the chamber base 11c, but it may be constructed in various manners, such as taking a structure in which the chamber base 11c is closed at the bottom thereof and the chamber base 11c is line-connected to the recycle chamber 201 spaced apart therefrom through an air vent disposed at the bottom of the chamber base 11c. The recycle unit 200 is connected to the chamber 11, i.e., the chamber body 11b or the chamber base 11c so that it re-collects the remaining inorganic powder other than the inorganic powder forming the solar cell layer on one side of the solar cell substrate 13 and delivers the re-collected remaining inorganic powder to the inorganic powder supply unit to recycle the re-collected remaining inorganic powder.

The recycle unit 200 includes a recycle pump 210, a recycle filter 220, and a recycle feeder 230. The control unit 50, which will be described later, generates a recycle pump control signal for application to the recycle pump 210 of the recycle unit 200 to operate the recycle pump 210. Thus, when the inorganic powder is trapped in the re-circulation process through the recycle filter 220, the control unit 50 may apply a recycle feed control signal to the recycle feeder 230 and the trapped inorganic powder is again supplied to crushed inorganic powder provision portion 300. The control unit 50 can perform a series of such recycling processes.

The substrate stage 12 includes a stage heating plate 12b that provides heat to the solar cell substrate 13. The substrate stage 12 includes a substrate stage base 12a and the stage heating plate 12b. The stage heating plate 12b provides heat to the substrate stage base 12a. The heat provided through the stage heating plate 12b is transferred to the solar cell substrate coming into close contact with the substrate stage base 12a and promotes more rapid and stable crystallization of the solar cell layer formed on the solar cell substrate 13.

The inorganic powder supply unit 20, 900 and 27 is disposed in the chamber, and includes a nozzle 27; 27-1, 27-2, 27-3, and 27-4, and an inorganic powder supply portion 20. The nozzle 27 takes a structure having a convergent-divergent shape to enable the supersonic flow of the inorganic powder aerosol discharged through the nozzle 27. The inorganic powder supply portion 20 includes an inorganic powder feeder 21 and a transport gas supply portion 20a. The transport gas supply portion 20a uses an inert gas such as $N_2$. The inorganic powder is transported to a transport gas supplied through the transport gas supply portion 20a to form an inorganic powder aerosol, which is in turn discharged in a supersonic flow through the nozzle 27.

In addition, the inorganic powder supply unit 20, 900 and 27 includes a flow regulator 900. The flow regulator 900 is disposed between the inorganic powder feeder 21 and the nozzle 27. The flow regulator 900 regulates a flow rate of the inorganic powder aerosol inputted to the nozzle through the inorganic powder feeder 21. The flow regulator 900 includes a flow rate regulator 910 and a pressure regulator 920. The flow rate regulator 910 is disposed on a line connected to the nozzle 27 through the inorganic powder feeder 21 to directly regulate the flow rate of the inorganic powder aerosol inputted to the nozzle 27. The pressure regulator 920 is an element that induces a pressure drop if a pressure exceeding a preset range is applied so as to prevent the generation of an excessive pressure of the inorganic powder aerosol delivered to the nozzle 27. The pressure regulator 920 is disposed between the inorganic powder feeder and the nozzle to prevent the occurrence of the backflow of the inorganic powder aerosol due to the build-up of a reduced pressure. In addition, the pressure regulator 920 may maintain the optimum operating pressure to correspond to a variation in the shape of the nozzle installed. That is, the nozzle may include various specifications depending on the design specifications. In addition, any one of a plurality of nozzle tips in the multi-nozzle may include a specification different from that of another nozzle tip. The optimum operating pressure for forming the supersonic flow at a corresponding nozzle may be provided regardless of the specification variation of the nozzle through the pressure regulator 920 so that the stable formation of the supersonic flow can be achieved.

The transport gas supply portion 20*a* includes a transport gas tank 21*a* and a transport gas compressor 22*a*. The transport gas tank 21*a* is connected to the transport gas compressor 22*a* through a connection line to deliver the transport gas to the transport gas compressor 27*a*. The transport gas compressor 22*a* provides kinetic energy for forming a high-pressure inorganic powder aerosol to the transport gas. A gas heater 400 may be disposed between the transport gas compressor 22*a* and the inorganic powder feeder 21. The gas heater 400 may more easily develop the supersonic flow by providing heat to the transport gas. The gas heater 400 primarily preheats the inorganic powder introduced into the inorganic powder feeder 21. In the case where the inorganic powder aerosol is coated on the solar cell substrate while colliding with the solar cell substrate under the supersonic flow conditions through the preheating of the inorganic powder, the transport gas compressor 22*a* provides sufficient kinetic energy to nano-sized inorganic powder. Simultaneously, in the case where the inorganic powder is added to the transport gas through the inorganic powder feeder 21, the transport gas compressor 22*a* transfers heat energy to the inorganic powder to form a melting state or a quasi-melting state of the inorganic powder in the inorganic powder aerosol to cause the inorganic powder to be formed into a predetermined ductile state so that when the inorganic powder aerosol collides with the solar cell substrate, air gaps or pores between the inorganic particles forming the solar cell layer can be blocked or minimized to form a homogeneous and uniform coating surface.

In the case where the nozzle is provided in plural numbers, or the nozzle itself is formed as the multi-nozzle or the multi-nozzle is provided in plural numbers, individual inorganic powder supply portions and supply lines for supplying each inorganic powder aerosol to each nozzle tip may be provided. In other words, as shown in FIG. 7, the inorganic powder feeder 21 and the supply line are provided in plural numbers. The transport gas having passed through the gas heater 400 is supplied to a plurality of supply lines branched off and is mixed with individual inorganic powders supplied through the individual inorganic powder feeders 21 to form a predetermined inorganic powder aerosol which can be in turn supplied to individual nozzles. In this case, each flow regulator is provided on each supply line so that the flow rate and the pressure state of each inorganic powder aerosol can be regulated.

In the meantime, as described in the above embodiment, the inorganic powder feeder 21 may include a separate crushed inorganic powder provision portion 300. When the inorganic powder crusher 310 is configured in the form of a ball mill, it crushes metal materials charged thereto into fine particles with a preset size, particularly into inorganic powder particles with a size less than a micro-size in this embodiment. The inorganic powder drier 330 receives the crushed inorganic powder from the inorganic powder crusher 310 and performs a dry process on the crushed inorganic powder under preset conditions. The inorganic powder from which moisture is removed in the inorganic powder drier 330 is delivered to the nozzle 27 via the inorganic powder supply portion 20 so that it can be discharged and sprayed in the form a supersonic flow.

In other words, the inorganic powder crusher 310 is operated in response to a crush control signal from the control unit 50 which will be described later, and the inorganic powder crushed by the inorganic powder crusher 310 is delivered to the inorganic powder drier 330, which in turn dries the inorganic powder in response to a dry control signal and removes moisture from the inorganic powder. At this time, the moisture-removed inorganic powder is supplied to the inorganic powder feeder 21, which in turn charges a predetermined inorganic powder to the transport gas in response to a feed control signal from the control unit 50 to form an inorganic powder aerosol so that the inorganic powder aerosol can be delivered to the flow regulator 900 along the supply lines.

In this case, a recycle connection line from the recycle feeder 230 of the recycle unit 200 is formed between the inorganic powder crusher 310 and the inorganic powder drier 330 so that the inorganic powder re-collected in the recycle unit 200 is re-charged into the recycle connection line and is provided through the inorganic powder feeder 21 after being subjected to a predetermined dry process. Thus, the remaining inorganic powder other than the inorganic powder forming the solar cell layer on the solar cell substrate in the chamber 11 can be recycled.

Meanwhile, the apparatus 10*a* for manufacturing an inorganic thin-film solar cell according to another embodiment of the present invention may further include a sensing unit 800, 500 and 600 that detects the state of the solar cell layer continuously formed on the solar cell substrate or detects the environmental state for forming the solar cell layer. The sensing unit 800, 500 and 600 includes a nozzle sensor portion 800, a probe sensor 500, and an image sensor portion 600. The nozzle sensor portion 800 includes a nozzle temperature sensor 810 and a nozzle pressure sensor 820. The nozzle sensor portion 800 is separately provided at each nozzle tip in the case where a plurality of nozzles, i.e., the multi-nozzle is disposed or individual plural nozzles are disposed. At this time, the detected nozzle temperature and pressure is delivered to the control unit 50. The nozzle temperature sensor 810 detects the temperature of the inorganic powder aerosol discharged through the nozzle, and the nozzle pressure sensor 820 detects the pressure of the inorganic powder aerosol discharged through the nozzle. In addition, the sensing unit 800 may further include a chamber temperature sensor 830 that detects the internal temperature of the chamber 11. The nozzle discharge velocity of the inorganic powder aerosol discharged through the nozzle can be calculated based on the detected signals of the nozzle sensor portion 830 and the chamber temperature sensor 830.

In addition, the sensing unit 800,600 and 500 includes an image sensor portion 600. The image sensor portion 600 detects an image of the surface or the cross-section of the solar cell substrate including the solar cell layer formed through the inorganic powder and applies the acquired image information to the control unit 50. The image sensor portion 600 may be implemented as a camera, and may take a structure in which a light source 601 is disposed so as to be opposed to the image sensing portion 600 with the solar cell substrate interposed therebetween. In addition, the image sensor portion 600 may be implemented as a scanning electron microscope (SEM) or a transmission electron microscope (TEM) that acquires a cross-sectional image besides a simple camera. Alternatively, a device including various scan sensing functions may be selected.

The sensing unit 800, 600 and 500 may include a probe sensor 500, if necessary. The probe sensor 500 is implemented as a scanning probe microscope. The probe sensor 500 includes a resolution of the level of atoms and molecules, and is useful in detecting the surface of the solar cell layer. In other words, the surface morphology of the solar cell layer and the physical characteristics for the solar cell layer can be detected using a near-field interaction in which the tip of the probe sensor 500 is positioned in the proximity of the solar cell layer on the solar cell substrate to detect the solar cell layer.

The information detected by the sensing unit 800, 600 and 500 is transmitted to the control unit 50. Then, the control unit 50 can control the feed rate of a continuous windable flexible solar cell substrate 13 of a roll-to-roll unit and the injection rate of the nozzle 27 through a predetermined judgment control process.

In the meantime, the apparatus 10*a* for manufacturing an inorganic thin-film solar cell according to another embodiment of the present invention includes a roll-to-roll unit 700 as an element for feeding the continuous windable flexible solar cell substrate 13. The roll-to-roll unit 700 includes a pay-out roller portion 710 and a wind-in roller portion 720. The pay-out roller portion 710 includes a pay-out roller motor 712 that generates a wind-in driving force and a pay-out roller 711 that rotates by receiving a driving force form the pay-out roller motor 712. The pay-out roller motor 712 provides a predetermined rotation driving force to the pay-out roller 711 in response to a driving control signal from the control unit 50 to cause the solar cell substrate in the form of a roll wound around the pay-out roller 711 to be rotated so that the solar cell substrate is fed while passing through the chamber 11.

A wind-in roller portion 720 is disposed at the other side of the chamber 11 so as to be opposed to the pay-out roller 710. The wind-in roller portion 720 includes a wind-in roller 721 and a wind-in roller motor 722. The wind-in roller motor 722 provides a predetermined rotational force to the wind-in roller 721 in response to a driving control signal from the control unit 50 to cause the wind-in roller 721 to be rotated so that the solar cell substrate on which the solar cell layer is formed can be wound around the wind-in roller 721.

In this embodiment, the apparatus 10*a* takes a structure in which the pay-out roller and the wind-in roller include a motor for providing the driving force, but it may take a structure in which the motor is disposed at any one side such as the wind-in roller portion side and a driven motor is disposed at the other side, if necessary. In addition, since there is a speed difference between the pay-out roller portion and the wind-in roller portion due to a difference in a radius of the continuous solar cell substrate wound around the wind-in roller, the apparatus 10*a* preferably take a structure in which individual motors are provided so as to perform smooth pay-out and wind-in operations without causing excessive tension on the solar cell substrate.

The apparatus 10*a* for manufacturing an inorganic thin-film solar cell according to the present invention includes a control unit 50, a storage unit 60, and an arithmetic operation unit 70, and may include an input unit 80, if necessary. The control unit 50 is connected to the sensing unit 800, 500 and 600 and receives a detected signal from the sensing unit. The storage unit 60 is connected to the control unit 50 for storing a preset data, and may store the detected signal from the sensing unit. The preset data stored in the storage unit 60 contains reference nozzle velocities (vs1 and vs2) and a reference thickness (ts). The reference nozzle velocities (vs1 and vs2) can be used as a reference value for determining whether or not the discharge of the nozzle 27 is in a normal state, i.e., whether or not the nozzle velocity is within a predetermined velocity range for the solar cell layer on the solar cell substrate 13. The reference thickness (ts) can be used as a comparable reference value for determining whether or not the thickness of the formed solar cell layer satisfies the thickness of the solar cell layer designed to obtain the designed solar cell optical conversion efficiency. The arithmetic operation unit 70 is connected to the control unit 50 and performs a predetermined operation process based on the detected signal of the sensing unit 800 in response to an operation control signal from the control unit 50. In other words, the arithmetic operation unit 70 can calculate the velocity of the inorganic powder aerosol discharged through the nozzle, i.e., the nozzle velocity (v) based on the detected signals from the nozzle temperature sensor 810, the nozzle pressure sensor 820, and/or the chamber temperature sensor 830.

In addition, the input unit 80 may be connected to the control unit 50 so that when a preset mode for the manufacturing process is present, a worker can select an execution mode and change the preset data stored in the storage unit.

Meanwhile, in the above embodiment, the nozzle disposed in the chamber may take various shapes. In FIG. 7, the nozzle 27 may take a structure in which a nozzle including a single nozzle tip is provided in plural numbers and the regions where individual nozzles are disposed are divided by chamber partition walls 29. Although it has been illustrated in FIG. 7 that the recycle chamber 201 takes a structure in which it is simply connected to the bottom end of the chamber 11, in the case where the partition walls 29 are disposed in the chamber 11, the recycle chamber 201 may take a structure in which it is formed as many as the number of the regions divided by the partition wall 29 and is connected to each divided region of the chamber 11. When the recycle chamber 201 takes an individual connection structure so that among different inorganic powder aerosols discharged onto the regions individually divided by partition walls 29, the remaining inorganic powder other than the inorganic powder forming the solar cell layer in the chamber 11 can be re-collected and recycled.

Figure 1:
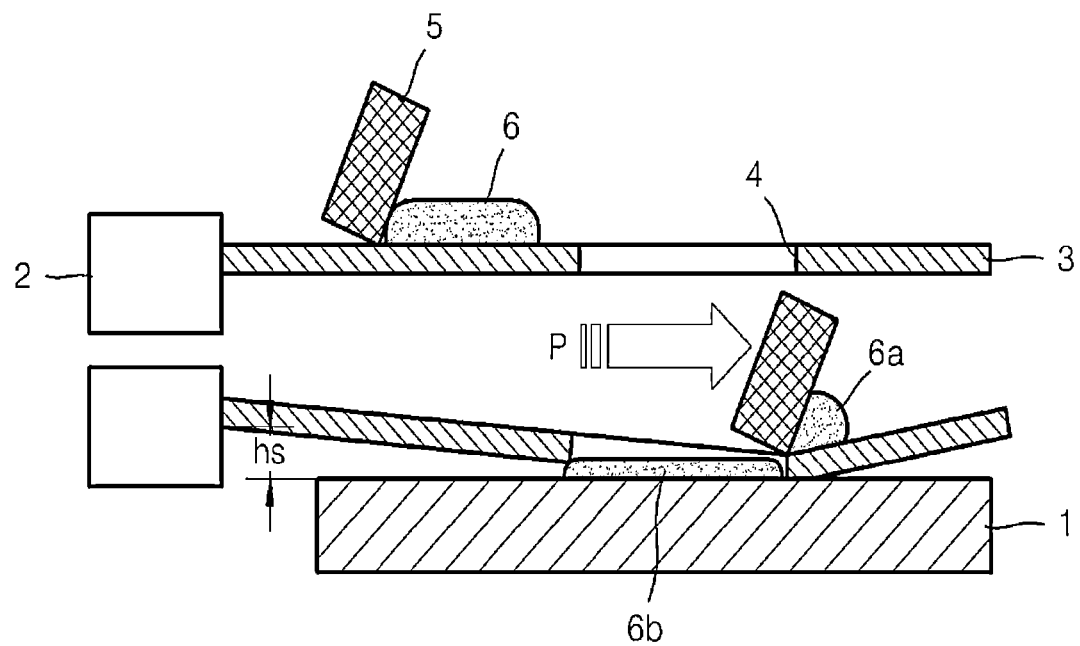
FIG. 1 is a schematic state view illustrating an electrode formation process according to the prior art.
Figure 2:
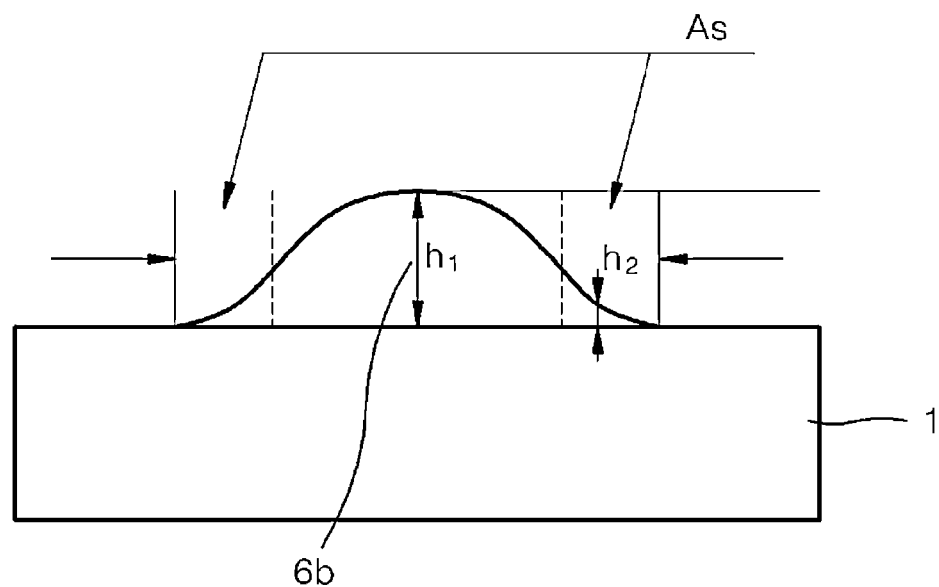
FIG. 2 is a schematic state view illustrating an electrode according to the prior art.

Although it has been illustrated in FIG. 7 that the nozzle takes a structure in which a nozzle including a single nozzle tip is provided in plural numbers, the nozzle of the present invention is not limited thereto. In other words, the nozzle 27 may take a structure in which a multi-nozzle including the multi-nozzle tip is disposed as shown in FIGS. 2 to 4. In addition, in the case where a plurality of multi-nozzles is provided, the nozzle may take a structure in which the regions where different inorganic powder aerosols are discharged are divided by the partition walls in the chamber, and a structure in which the chamber itself is divided into several internal spaces.

In addition, the inorganic powder discharged through the respective nozzle tips may be formed of a single inorganic material or a mixture of a plurality of inorganic materials, but various modifications can be made depending on the design specifications.

Figure 8:
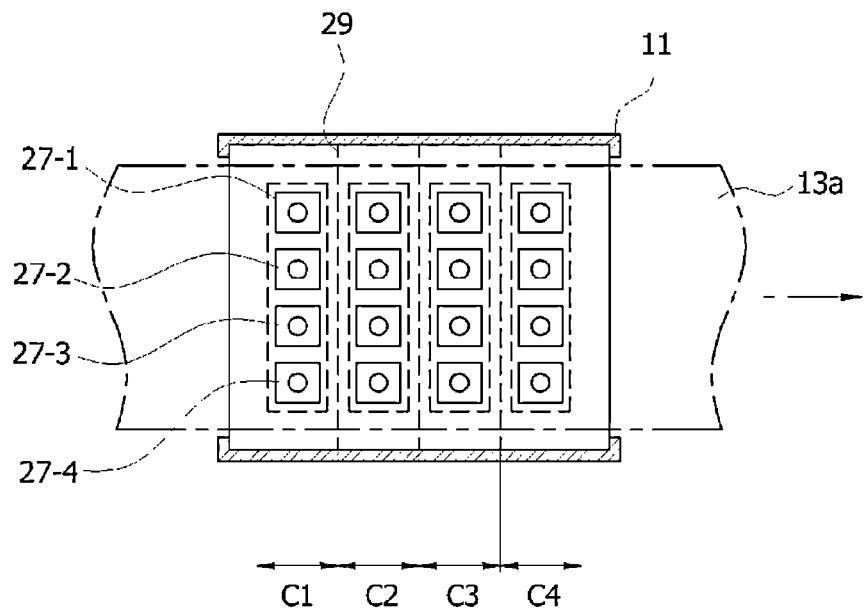
FIGS. 8 to 10 are schematic state views illustrating an arrangement of a nozzle portion and a chamber of an apparatus for manufacturing an inorganic thin-film solar cell according to another embodiment of the present invention.
Figure 9:
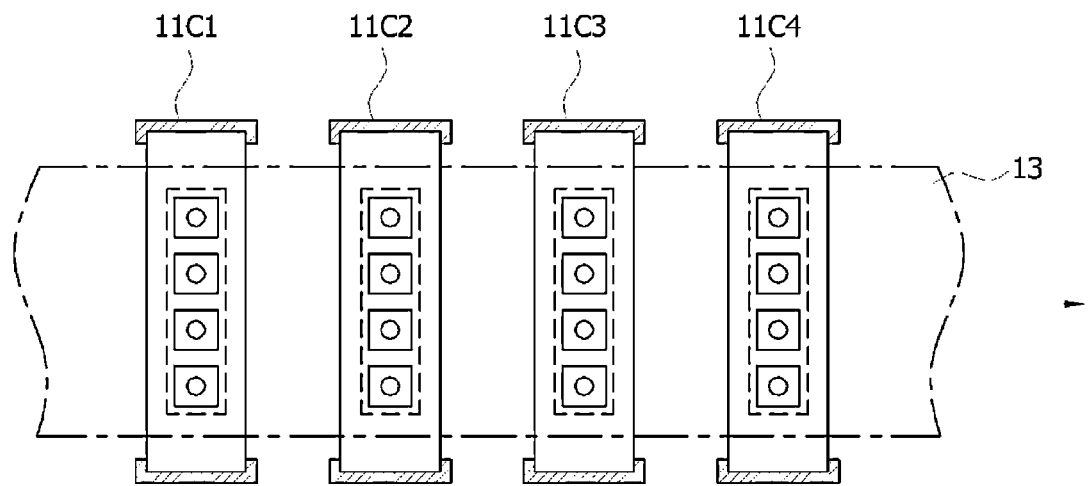
Figure 10:
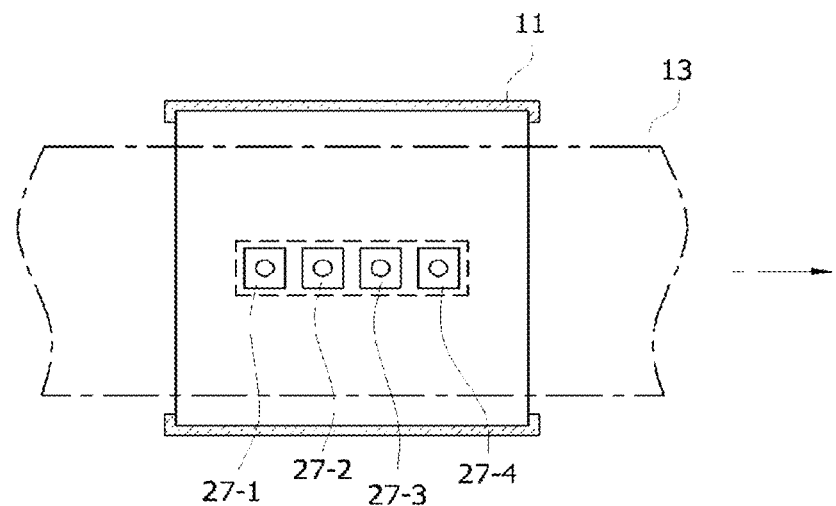
Figure 11:
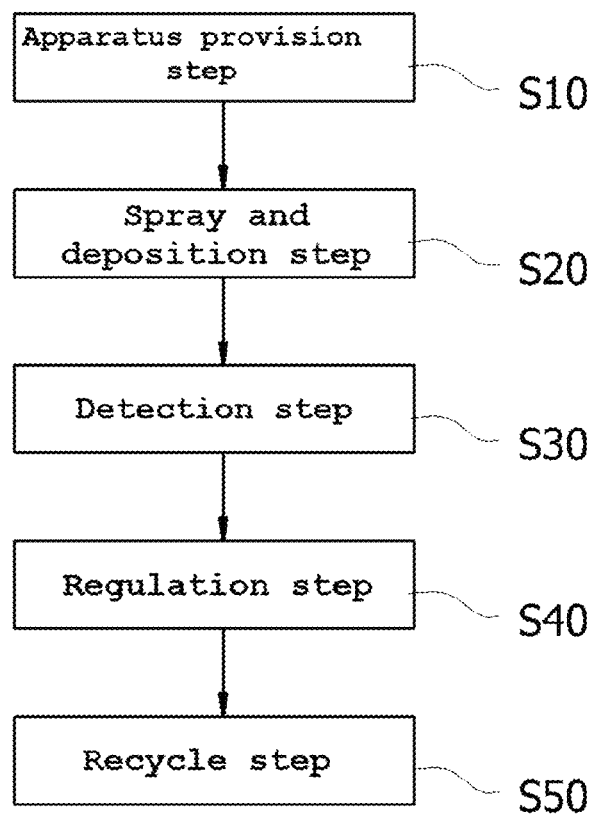
FIGS. 11 to 13 are flowcharts illustrating a control process of an apparatus for manufacturing an inorganic thin-film solar cell according to another embodiment of the present invention.
Figure 12:
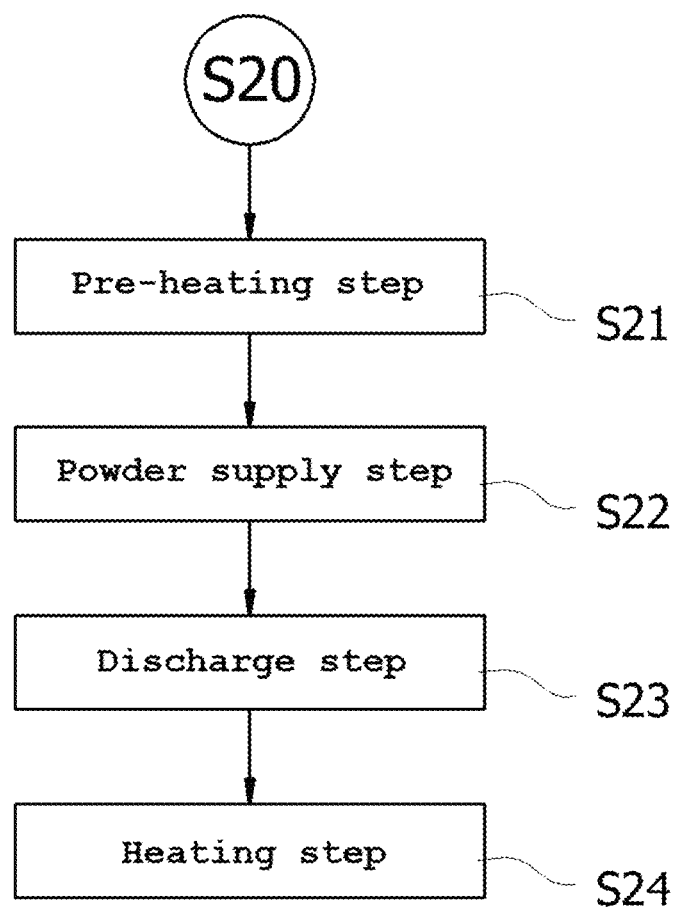
Figure 13:
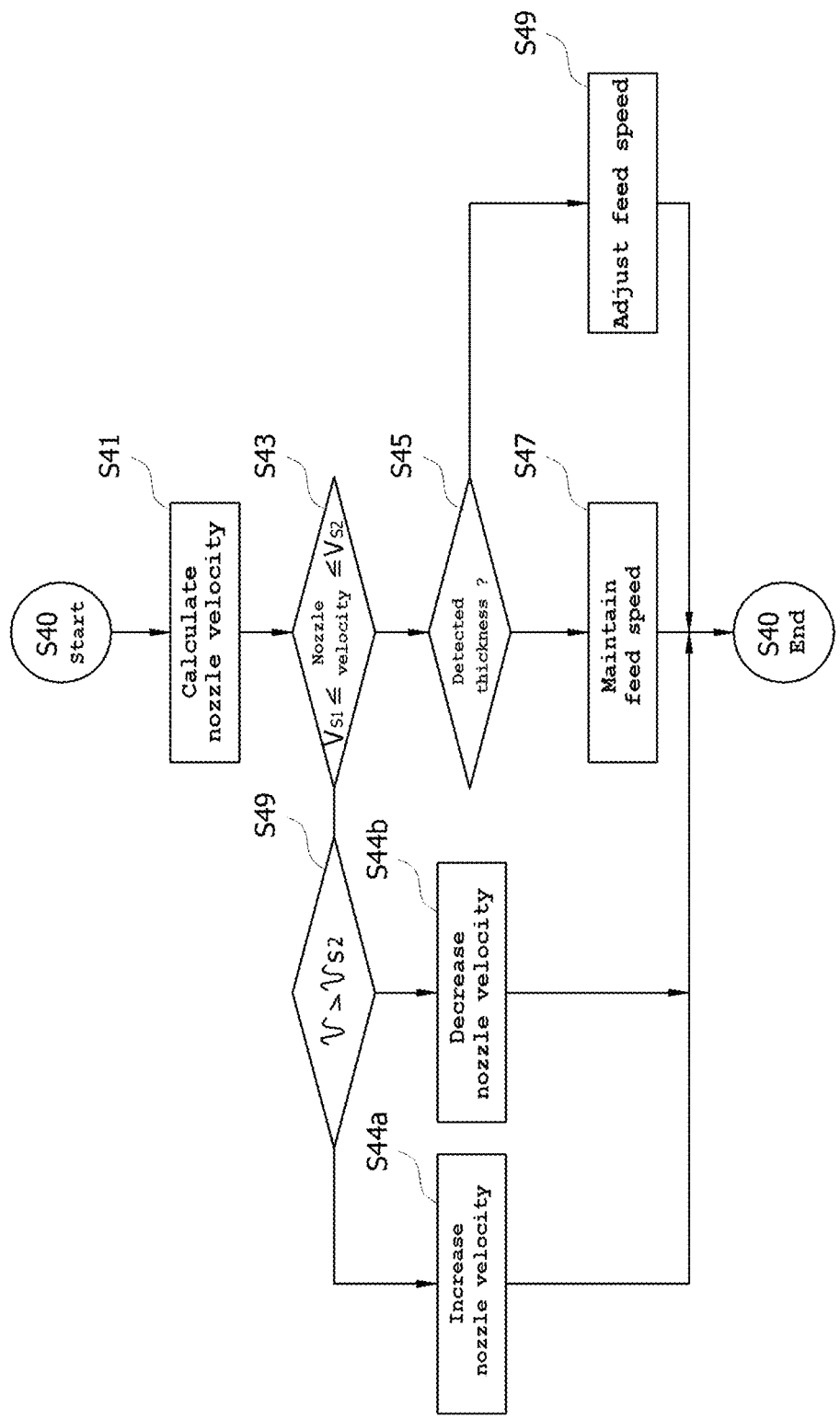

As shown in FIG. 8, the discharge region for the inorganic powder aerosol is divided into several spaces C1, C2, C3 and C4 through a plurality of partition walls 29 in a single chamber 11, and the multi-nozzle including individual nozzles or a plurality of nozzle tips 27-1, 27-2, 27-3, and 27-4 may be disposed in the respective divided regions. Herein, the chamber 11 uses a single chamber, and takes a structure in which the region in the signal chamber is divided the partition walls 29. On the other hand, as shown in FIG. 9, a plurality of chambers 11C1, 11C2, 11C3, and 11C4 are provided, and each chamber takes a structure in which individual nozzle or multi-nozzles for discharging individual inorganic powder aerosols onto the solar cell substrate 13 are disposed. In other words, the chamber 11 may take a structure in which the inorganic powder aerosol discharged from one multi-nozzle contains an inorganic powder different from one contained in the inorganic powder aerosol discharged from another multi-nozzle. The inorganic powder used in the present invention may contain one or more selected from the group consisting of Cu, In, Ga, Se, Cd, Te, S, Mo, and ZnO. Each chamber may include a separate recycle chamber so that the remaining inorganic powder present in each chamber can be collected and recycled.

A method for controlling an apparatus for manufacturing an inorganic thin-film solar cell according to another embodiment of the present invention will be described hereinafter with reference to the accompanying drawings.

The control method of the apparatus for manufacturing an inorganic thin-film solar cell includes an apparatus provision step S10, a spray and deposition step S20, a detection step S30, and a regulation step S40. The control method of the present invention may further include a recycle step S50 of recovering the remaining inorganic powder present in the chamber.

In the apparatus provision step S10, the inorganic thin-film solar cell manufacturing apparatus 10a according to the above embodiment is provided.

To avoid a redundant description, the same constitution of inorganic thin-film solar cell manufacturing apparatus 10a will be replaced with the constitution in the above embodiment. After the inorganic thin-film solar cell manufacturing apparatus 10a is provided, the control unit 50 performs the spray and deposition step S20. In the spray and deposition step S20, the control unit 50 applies a supply control signal to the inorganic powder supply unit 20, 900 and 27, and supplies a feed control signal to the roll-to-roll unit 700 to discharge the inorganic powder aerosol to the solar cell substrate so that the solar cell layer can be formed on the solar cell substrate using the inorganic powder.

The spray and deposition step S20 may take a two-stage heating structure scheme that including a pre-heating step S21, a powder supply step S22, a discharge step S23, and a heating step S24. That is, the control unit 50 applies a transport control signal to the transport gas supply portion 20a and applies a pre-heating control signal to the gas heater 400. Namely, the gas heater 400 may be disposed between the transport gas supply portion 20a and the inorganic powder feeder 21. The transport gas flowing along the supply line through the transport gas supply portion 20a receives heat from the gas heater 400 to form a pre-heating state so that heat can be supplied to the inorganic powder with a nano-sized particle to form a predetermined melting state, i.e., a ductile state. In addition, the transportation of the molecules of the transport gas is increased by virtue of the heat supply of the transport gas so that the supersonic flow injected through the nozzle 27 can be obtained more smoothly.

After the pre-heating step, in the powder supply step S22, the control unit 50 applies a feed control signal to the inorganic powder feeder 21 to supply the inorganic powder to the transport gas. In this case, the inorganic powder may be supplied to each of a plurality of inorganic powder feeders, and in the case where a plurality of multi-nozzles is disposed, the same inorganic powder may be delivered to a multi-nozzle tip of each multi-nozzle. Likewise, the multi-nozzle may be constructed in various manners.

Thereafter, in the discharge step S23, the control unit 50 applies a flow control signal to the flow regulator 900 to discharge a given inorganic powder aerosol from the nozzle. The flow regulator 900 may include the flow rate regulator 910 and the pressure regulator 920 as described above. A predetermined flow rate control signal and a predetermined pressure control signal from the control unit 50 can be applied to the flow rate regulator 910 and the pressure regulator 920. Thus, the flow rate regulator 910 can control the flow rate of the inorganic powder aerosol introduced to the nozzle through the supply line, and the pressure regulator 920 can prevent the build-up of the excessive pressure or degradation of the reduced pressure of the inorganic powder aerosol introduced to the nozzle through the supply line.

Then, the control unit 50 applies a heating control signal to the stage heating plate 12b of the substrate stage 12 to cause a predetermined heat to be transferred to the substrate stage base 12a so that crystallization of the solar cell layer discharged through the nozzle 27 and coated on the solar cell substrate 13 is enhanced, thereby minimizing formation of the pores between inorganic powder particles deposited on the solar cell substrate to form the solar cell layer with a more dense structure, so that optical conversion efficiency of the solar cell layer can be improved.

Thereafter, the control unit 50 applies a detection control signal to the sensing unit 800, 500 and 600 and executes the detection step S30 in which the detected signals acquired from the sensing unit is applied the control unit 50.

Then, the control unit 50 executes the regulation step S40 of regulating the discharge velocity of the inorganic powder aerosol discharged through the nozzle to form the designed coating state of the solar cell layer, and the feed rate of the roll-to-roll unit using the detected signal obtained in the detection step S30 and the preset data stored in the storage unit 60. In the regulation step S40, the control unit 50 applies an operation control signal to the arithmetic operation unit 70 to allow the arithmetic operation unit 70 to calculate the velocity of the inorganic powder aerosol discharged through the nozzle, i.e., the nozzle velocity (v) for application to the control unit 50 using the detected signals of the sensing unit, i.e., the nozzle temperature and the nozzle pressure of the nozzle, the chamber temperature, and constant date contained in the preset data.

$$\left(\frac{P_o}{P_e}\right) = \left\{1 + \left(\frac{\gamma-1}{2}\right)M_e^2\right\}^{\frac{\gamma}{\gamma-1}}$$

$$v = M_e\sqrt{\gamma RT}\sqrt{\frac{C_D A_p \rho_g x}{m_p}}$$

The nozzle discharge velocity set in the input unit 80 can be confirmed based on the pressure and the temperature of the nozzle discharge gas at the nozzle discharge port 27-1. The above Equation can be somewhat modified depending on the design specifications of the convergent-divergent nozzle.

The velocity (v) of the inorganic powder particle can be calculated using the above Equation when, in the above Equation, $P_o$ denotes a pressure of the inorganic powder aerosol or the transport gas at a nozzle inlet, T denotes a temperature of the inorganic powder aerosol at a nozzle outlet, $P_e$ denotes a denotes a pressure of the inorganic powder aerosol at the nozzle outlet, $M_e$ denotes a Mach number at the nozzle outlet, R denotes a gas constant, $C_D$ denotes a drag coefficient, $A_p$ denotes an area (projected area) of the inorganic powder, $\rho_g$ denotes a density of the transport gas or the inorganic powder aerosol, x denotes a distance between the nozzle inlet and the nozzle outlet for the inorganic powder, $m_p$ denotes a mass of the inorganic powder particle.

The control unit 50 determines whether or not the nozzle velocity (v) is within the range of the reference nozzle velocities (vs1 and vs2) by comparing the calculated nozzle velocity (v) with the reference nozzle velocity (vs1, vs2; vs1<<vs2) of the preset data.

Figure 14:
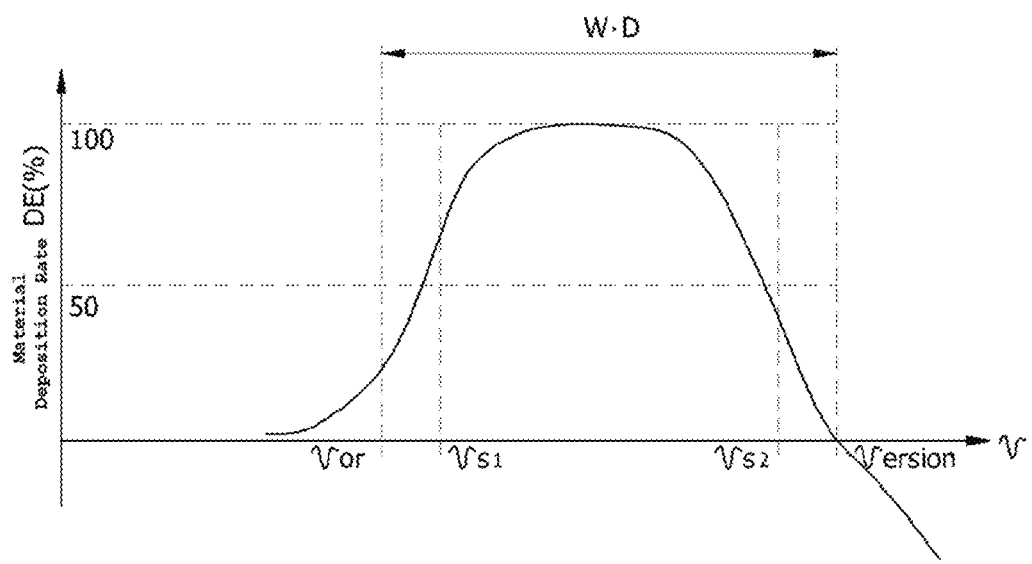
FIG. 14 is a schematic graph illustrating a material deposition rate of an inorganic powder used in an apparatus for manufacturing an inorganic thin-film solar cell according to another embodiment of the present invention.

FIG. 14 is a schematic graph illustrating a material deposition rate of an inorganic powder to a material speed of the inorganic powder used in the present invention.

A window (W.D) is formed between a threshold velocity (vcrit) and an erosion velocity (verosion). In this embodiment, a maximum reference nozzle velocity (vs2) was set to be smaller than the erosion velocity and a minimum reference nozzle velocity (vs1) was set to be larger than the threshold velocity in order to minimize formation of the pores in the solar cell layer and obtain a dense structure of the solar cell layer so that the material deposition rate reached more than 50%. But the reference nozzle velocities (vs1 and vs2) may be set variously within the range between the threshold velocity and the erosion velocity.

If the control unit 50 determines that the nozzle velocity (v) is not within the range of the reference nozzle velocities (vs1 and vs2), the program proceeds to step S44 where it determines whether or not the nozzle velocity is larger than the maximum reference nozzle velocity (vs2) of the reference nozzle velocities. If it is determined at step S44 that the nozzle velocity is larger than the maximum reference nozzle velocity (vs2), the control unit 50 applies a control signal to the transport gas compressor 22a and/or the flow rate regulator 910 of the flow regulator 900 to decrease the nozzle velocity and thus the discharge velocity. On the other hand, if it is determined at step S44 that the nozzle velocity is less than the maximum reference nozzle velocity (vs2), the control unit 50 determines that the nozzle velocity (v) is smaller than the minimum reference nozzle velocity (vs1) and applies a control signal to the transport gas compressor 22a and/or the flow rate regulator 910 or the pressure regulator 920 of the flow regulator 900 to increase the nozzle velocity and thus the discharge velocity. This control of the nozzle velocity may be performed separately for each nozzle tip and in the unit of the multi-nozzle, but various configurations can be made.

In the meantime, If it is determined at step S43 that the nozzle velocity (v) is within the range of the reference nozzle velocities (vs1 and vs2), the program proceeds to step S45 where the control unit 50 determines that the current nozzle velocity is a velocity for forming a smooth coating layer of the solar cell layer and maintains the nozzle velocity uniformly. In addition, the control unit 50 compares the thickness (t) of the solar cell layer of the detected signals obtained from the sensing unit with the reference thickness (ts) of the preset data.

The thickness (t) of this solar cell layer, i.e., the solar cell layer deposited on the solar cell substrate through the supersonic flow is obtained from the detected signal of the image sensor portion 600 or the probe sensor 500. Then, the control unit 50 can compare the thickness (t) of the solar cell layer with the reference thickness (ts) and determine whether or not the inorganic powder is coated on the solar cell substrate into a designed thickness. If it is determined that the thickness (t) of the solar cell layer is not identical to the reference thickness (ts) or is not within the preset range based on the reference thickness (ts), the control unit 50 determines that the current feed rate is so rapid or slow and applies a calibrated feed control signal to the roll-to-roll unit 700 to adjust the feed rate of the inorganic powder aerosol to regulate a wind-in or pay-out speed of the solar cell substrate so that the coating layer can be formed into a designed thickness.

On the other hand, if the thickness (t) of the solar cell layer is identical to the reference thickness (ts) or is within the preset range based on the reference thickness (ts), the control unit 50 determines that the current feed rate is appropriate and maintains the feed rate (S47).

Thereafter, the control unit 50 can additionally executes the recycle step S50. Through this recycle step S50, a load of the recycle pump 210 can be adjusted. In this case, the recycle pump is provided in plural numbers, and in the case where the recycle pump is separately disposed at the regions divided by the partition walls 29, it may take a structure in which the load thereof can be adjusted separately, but various modifications can be made.

Figure 15:
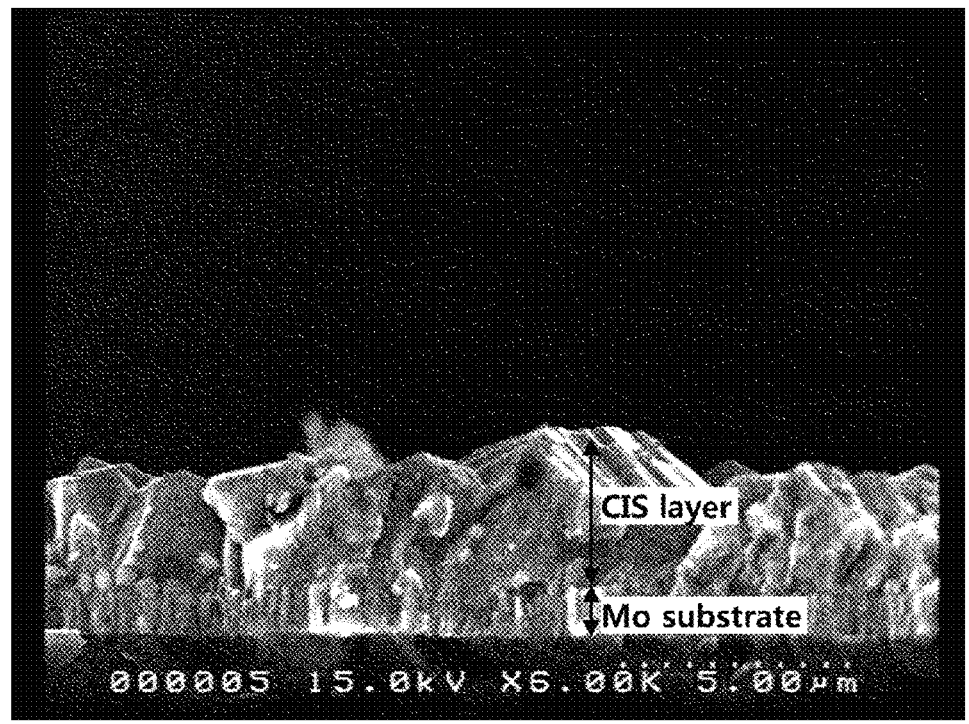
FIGS. 15 and 16 are diagrammatic diffraction analysis views illustrating a cross-sectional state of a solar cell layer on a solar cell substrate and an X-ray diffraction state through the cross-sectional state of the solar cell layer formed through an apparatus for manufacturing an inorganic thin-film solar cell according to another embodiment of the present invention.

FIG. 15 is a cross-sectional view illustrating the solar cell substrate including the solar cell layer formed through an apparatus 10a for manufacturing an inorganic thin-film solar cell according to another embodiment of the present invention.

Figure 16:
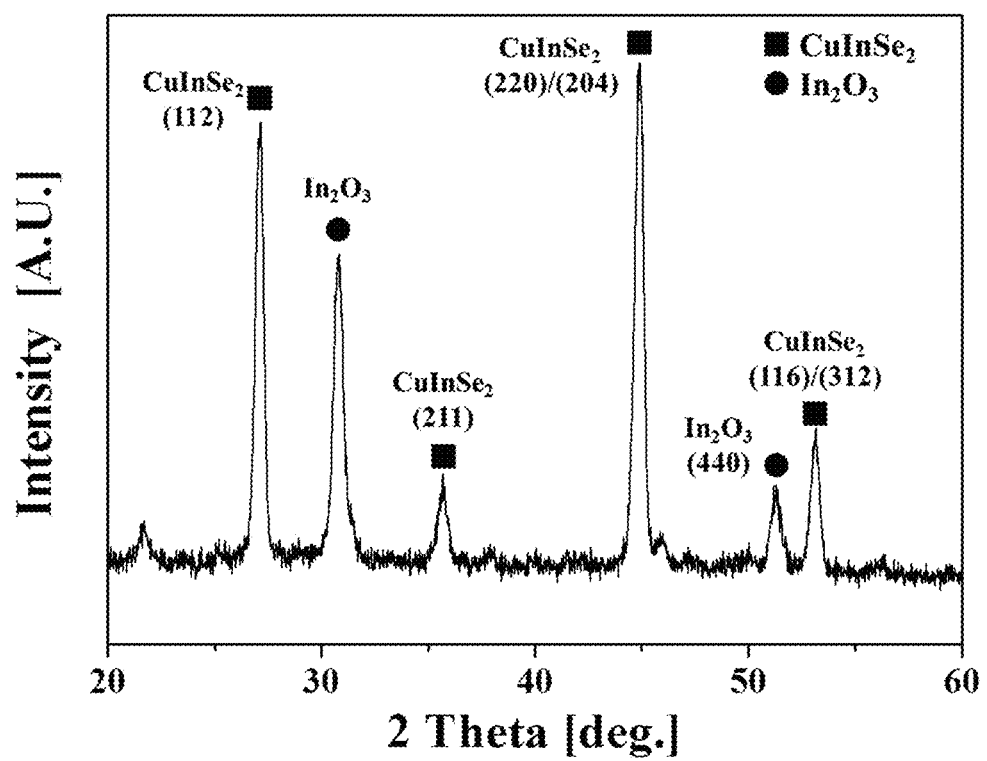

In FIG. 15, there is shown a resultant photo of a solar cell layer deposited into a thickness of 2-3 μm on the solar cell substrate using an inorganic powder with copper (Cu) particles, an inorganic powder with indium (In) particles, and an inorganic powder with selenium (Se) particles. The transport gas is pre-heated at 350~500° C. within the pressure range of 6-7 bar in the pre-heating step, and then is discharged and sprayed onto the solar cell substrate through the nozzle 27 to thereby form the solar cell layer on the solar cell substrate. At this time, Cu, In and Se were selected as a material of the sprayed inorganic powder. FIG. 15 shows a cross-sectional photo taken by a scanning electron microscope (SEM), and FIG. 16 shows a graph obtained using an X-ray diffraction analyzer (XRD). As a result of the diffraction analysis on the CIS solar cell layer, a (112) peak corresponding to a $CuInSe_2$ compound was observed in the proximity of 2theta=26.9°, and other main peaks were observed at $CuInSe_2$ (211), $CuInSe_2$ (220)/(204), and $CuInSe_2$ (116)/(312) (see FIG. 16). As shown in FIG. 16, the solar cell layer formed by the apparatus for manufacturing an inorganic thin-film solar cell takes a structure in which carbon (C) is excluded, thereby preventing a degradation of the efficiency by a carbon layer and thus maximizing the optical conversion efficiency of the solar cell layer.

The embodiments as described above are merely illustrative and the invention is not limited to these embodiments. It will be appreciated by a person having an ordinary skill in the art that various equivalent modifications and variations of the embodiments can be made without departing from the spirit and scope of the present invention. Therefore, the true technical scope of the present invention should be defined by the technical spirit of the appended claims.

INDUSTRIAL APPLICABILITY

Various modifications can be made in the range of providing the inorganic thin-film solar cell manufacturing apparatus, which forms the solar cell layer using a low-temperature spray process through the supersonic flow of the inorganic powder aerosol of the solar cell.

The invention claimed is:

1. An apparatus for manufacturing an inorganic thin-film solar cell, the apparatus comprising:
   a substrate stage which is mounted in a chamber and in which a windable solar cell substrate is disposed, the substrate stage including a stage heating plate configured to provide heat to the solar cell substrate;
   a roll-to-roll unit disposed at both ends of the chamber, the roll-to-roll unit including a pay-out roller mounted at one end thereof so as to allow the solar cell substrate to be paid out therefrom, and a wind-in roller mounted at the other end thereof so as to allow the solar cell substrate to be wound therearound so that the solar cell substrate can be moved while passing through the chamber; and
   an inorganic powder supply unit disposed in the chamber, the inorganic powder supply unit including a nozzle configured to discharge an inorganic powder aerosol containing an inorganic powder onto the substrate stage in a supersonic flow so as to form a solar cell layer on the solar cell substrate, and an inorganic powder supply portion configured to supply the inorganic powder aerosol to the nozzle, wherein the inorganic powder is deposited on the solar cell substrate, wherein the inorganic powder supply unit comprises a flow regulator disposed between the inorganic powder supply portion and the nozzle and configured to regulate a flow rate of the inorganic powder aerosol, and the inorganic powder supply portion comprises:

a transport gas supply portion configured to provide a transport gas for transporting the inorganic powder; and an inorganic powder supply portion configured to receive the transport gas from the transport gas supply portion and feed the inorganic powder aerosol to the nozzle through the supply of the inorganic powder by virtue of the flow of the transport gas, wherein the apparatus further comprises:

a sensing unit including a nozzle temperature sensor disposed at the nozzle and configured to detect the temperature of the inorganic powder aerosol through the nozzle, a nozzle pressure sensor disposed at the nozzle and configured to detect the pressure of the inorganic powder aerosol through the nozzle, a chamber temperature sensor configured to detect the internal temperature of the chamber, and an image sensor portion disposed between the nozzle and the wind-in roller and configured to detect image information on the solar cell substrate;

a control unit connected to the sensing unit and configured to receive the detected signal from the sensing unit;

an arithmetic operation unit configured to calculate the nozzle velocity of the inorganic powder aerosol discharged through the nozzle based on the detected signals of the nozzle pressure sensor and the nozzle temperature sensor in response to an operation control signal from the control unit; and a storage unit connected to the storage unit and configured to store a preset data containing a reference nozzle velocity compared with the nozzle velocity to determine whether or not the discharge state of the nozzle is in a normal state, and a reference thickness compared with the thickness information extracted from the image information to determine whether or not the thickness of the inorganic powder sprayed onto the one side of the solar cell substrate is normal.

2. The apparatus according to claim 1, wherein the inorganic powder supply portion further comprises a gas heater provided at the transport gas supply portion and the inorganic powder supply portion and configured to supply heat to the transport gas to pre-heat the inorganic powder introduced into the inorganic powder supply portion.

3. The apparatus according to claim 1, wherein the multi-nozzle is a multi-nozzle configured to individually discharge a plurality of inorganic powder aerosol in a supersonic flow.

4. The apparatus according to claim 3, wherein the multi-nozzle is provided in plural numbers, and any one of the plurality of multi-nozzles discharges an inorganic powder different from one discharged from another multi-nozzle.

5. The apparatus according to claim 3, wherein the inorganic powder comprises one or more selected from the group consisting of Cu, In, Ga, Se, Cd, Te, S, Mo, and ZnO.

6. The apparatus according to claim 3, further comprising a recycle unit connected to the chamber and configured to re-collect the remaining inorganic powder other than the inorganic powder forming the solar cell layer.

7. A method for controlling an apparatus for manufacturing an inorganic thin-film solar cell, the method comprising:

an apparatus provision step of providing an apparatus for manufacturing an inorganic thin-film solar cell, the apparatus comprising:

a substrate stage which is mounted in a chamber and in which a windable solar cell substrate is disposed, the substrate stage including a stage heating plate configured to provide heat to the solar cell substrate;

a roll-to-roll unit disposed at both ends of the chamber, the roll-to-roll unit including a pay-out roller mounted at one end thereof so as to allow the solar cell substrate to be paid out therefrom, and a wind-in roller mounted at the other end thereof so as to allow the solar cell substrate to be wound therearound so that the solar cell substrate can be moved while passing through the chamber;

an inorganic powder supply unit disposed in the chamber, the inorganic powder supply unit including a nozzle configured to discharge an inorganic powder aerosol containing an inorganic powder onto the substrate stage in a supersonic flow so as to form a solar cell layer on the solar cell substrate, and an inorganic powder supply portion configured to supply the inorganic powder aerosol to the nozzle, wherein the inorganic powder is deposited on the solar cell substrate;

a sensing unit including a nozzle temperature sensor disposed at the nozzle and configured to detect the temperature of the inorganic powder aerosol through the nozzle, a nozzle pressure sensor disposed at the nozzle and configured to detect the pressure of the inorganic powder aerosol through the nozzle, a chamber temperature sensor configured to detect the internal temperature of the chamber, and an image sensor portion disposed between the nozzle and the wind-in roller and configured to detect image information on the solar cell substrate;

a control unit connected to the sensing unit and configured to receive the detected signal from the sensing unit;

an arithmetic operation unit configured to calculate the nozzle velocity of the inorganic powder aerosol discharged through the nozzle based on the detected signals of the nozzle pressure sensor and the nozzle temperature sensor in response to an operation control signal from the control unit; and a storage unit connected to the storage unit and configured to store a preset data containing a reference nozzle velocity compared with the nozzle velocity to determine whether or not the discharge state of the nozzle is in a normal state, and a reference thickness compared with the thickness information extracted from the image information to determine whether or not the thickness of the inorganic powder sprayed onto the one side of the solar cell substrate is normal;

a spray and deposition step of allowing the control unit to apply a supply control signal to the inorganic powder supply unit, and apply a feed control signal to the roll-to-roll unit to discharge the inorganic powder aerosol to the solar cell substrate to cause the inorganic powder to be deposited on the solar cell substrate;

a detection step of allowing the control unit to apply a detection control signal to the sensing unit; and a regulation step of allowing the control unit to regulate the discharge velocity of the nozzle and the feed rate of the solar cell substrate using the detected signal of the sensing unit and the preset data stored in the storage unit.

8. The method according to claim 7, wherein the inorganic powder supply unit comprises a flow regulator disposed between the inorganic powder supply portion and the nozzle and configured to regulate a flow rate of the inorganic powder aerosol, wherein the inorganic powder supply portion comprises:

a transport gas supply portion configured to provide a transport gas for transporting the inorganic powder;

an inorganic powder supply portion configured to receive the transport gas from the transport gas supply portion and feed the inorganic powder aerosol to the nozzle through the supply of the inorganic powder by virtue of the flow of the transport gas; and a gas heater provided at the transport gas supply portion and the inorganic powder supply portion and configured to supply heat to the transport gas to pre-heat the inorganic powder introduced into the inorganic powder supply portion, and wherein the spray and deposition step comprise:

a pre-heating step of allowing the control unit to apply a transport control signal to the transport gas supply portion and apply a pre-heating control signal to the gas heater to pre-heat the transport gas;

a powder supply step of allowing the control unit to apply a feed control signal to the inorganic powder feeder to supply the inorganic powder to the inorganic powder feeder; and a discharge step of allowing the control unit to apply a flow control signal to the flow regulator to discharge the inorganic powder aerosol from the nozzle.

9. The method according to claim 8, further comprising a regulation step, wherein the regulation steps comprises:

a nozzle velocity calculation step of allowing the arithmetic operation unit to calculate the nozzle velocity of the inorganic powder aerosol discharged through the nozzle based on the detected signals of the nozzle pressure sensor and the nozzle temperature sensor in response to an operation control signal from the control unit;

a nozzle velocity determination step of allowing the control unit to compare the nozzle velocity with the reference nozzle velocity; and a deposition thickness determination step of, if the nozzle velocity conforms to the reference nozzle velocity in the nozzle velocity determination step, comparing the thickness information extracted from the image information with the reference thickness.

* * * * *